United States Patent [19]

Chapman et al.

[11] Patent Number: 5,051,704

[45] Date of Patent: Sep. 24, 1991

[54] FEEDFORWARD DISTORTION CANCELLATION CIRCUIT

[75] Inventors: Ronald H. Chapman, Carol Stream; William J. Turney, Schaumburg, both of Ill.

[73] Assignee: Motorola, Inc., Schaumburg, Ill.

[21] Appl. No.: 479,498

[22] Filed: Feb. 6, 1990

[51] Int. Cl.⁵ .............................................. H03F 1/32
[52] U.S. Cl. ..................................... 330/52; 330/149; 330/151
[58] Field of Search .......................... 330/52, 149, 151; 328/163

[56] References Cited

U.S. PATENT DOCUMENTS 4,926,134  5/1990  Olver ............................. 330/149 X

FOREIGN PATENT DOCUMENTS 2107540  4/1983  United Kingdom ................ 330/149

Primary Examiner—James B. Mullins

[57] ABSTRACT

A feedforward distortion cancellation circuit active control of both cancellation loops and a pilot signal and using least means squared circuits in both cancellation loops is disclosed. According to the invention, by using a pilot signal as the reference signal in a least means squared cancellation circuit, the required level of cancellation is reduced and thus it is easier to fabricate the circuit and the circuit is more stable.

4 Claims, 3 Drawing Sheets

—PRIOR ART—

5,051,704

FEEDFORWARD DISTORTION CANCELLATION CIRCUIT

TECHNICAL FIELD

This application relates to feedforward distortion cancellation circuits using a pilot signal, and more particularly to a feedforward distortion cancellation circuit using least means squared circuits in both cancellation loops.

BACKGROUND OF THE INVENTION

Feed-forward error control was originated by Harold S. Black in 1924, a precursor by several years of his more famous accomplishment of feedback control. Through 1960, it was viewed somewhat as a curiosity, and was used only in the context of a McMillan circuit, which fused the two Black concepts of feedback and feed-forward. Other feed-forward circuits have been known. See, for example, H. Seidel, "A Microwave Feed-Forward Experiment," Bell System Technical Journal, November, 1971, pages 2879-2899.

Such a prior art arrangement is shown in FIG. 1. There is shown a feed-forward distortion cancellation circuit. As is shown, an input 1 (x) is applied to an amplifier 2, producing a non-linear output 8 equal to $Ax + A_3x^3$. The non-linear quantity $A_3x^3$ is illustrative of the distortions due to the non-linearities associated with the amplifier 2. The output 8 is then input to an attenuator 4, and a first input of a summing device 6. The feedforward path 11 provides the quantity $-A_3x^3$ to a second input of the summing device 6, thus producing the linear quantity $Ax$ to the output 7.

A second such prior art arrangement is shown in FIG. 2. There is shown a feedforward distortion cancellation circuit with active control of a first cancellation loop. This circuit is similar to the circuit of FIG. 1 except that a variable attenuator and phase shifter 22(B1) is arranged with a comparison circuit 23 and amplitude and phase control line 35 to maintain the relationship $B1*B2=A$.

A third such prior art arrangement is shown in FIG. 3. There is shown a feedforward distortion cancellation circuit with active control of both cancellation loops. This circuit is similar to the circuit of FIG. 2 except that a second variable attenuator and phase shifter 49 (B3) is arranged with a second comparison circuit 50 and a second amplitude and phase control line 56 to maintain the relationship $B3*B4=B2$.

A fourth such prior art arrangement is shown in FIG. 4. There is shown a feedforward distortion cancellation circuit with active control of both cancellation loops and an identification or pilot signal, also known in the art as a "TAG," used as a reference. Note the pilot signal 80 is applied to the output of amplifier 62 and as one input to the second comparison circuit 70. See, for example, FIG. 7 in the above-cited BSTJ article by H. Seidel.

SUMMARY OF THE INVENTION

The applicant has discovered that a least mean squared circuit is well-suited for use with feedforward distortion cancellation circuits with active control of both cancellation loops. Moreover, according to the invention, by using a pilot signal as the reference signal in such a feedforward distortion cancellation circuit, the required level of cancellation is reduced. Also, it is easier to fabricate the circuit and the circuit is more stable.

DETAILED DESCRIPTION OF THE INVENTION

Figure 1:
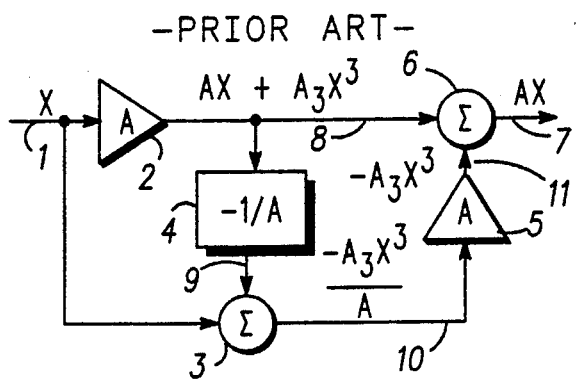
FIGS. 1-4 show various feed-forward distortion cancellation circuits, as in the prior art.
Figure 2:
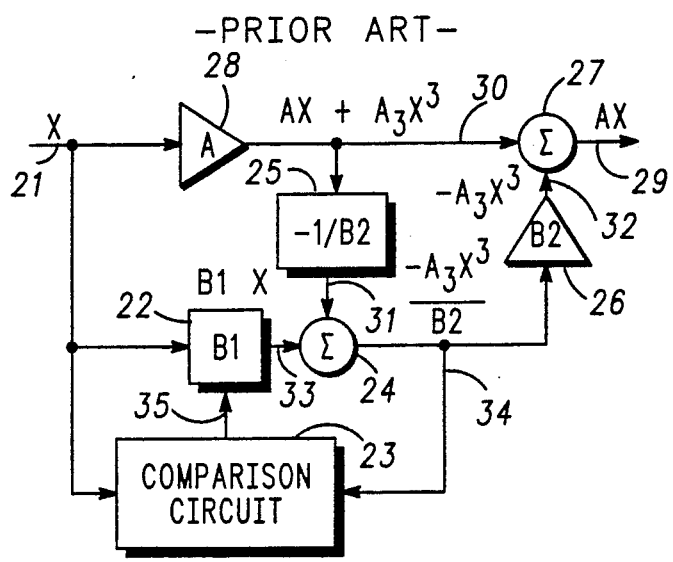
Figure 3:
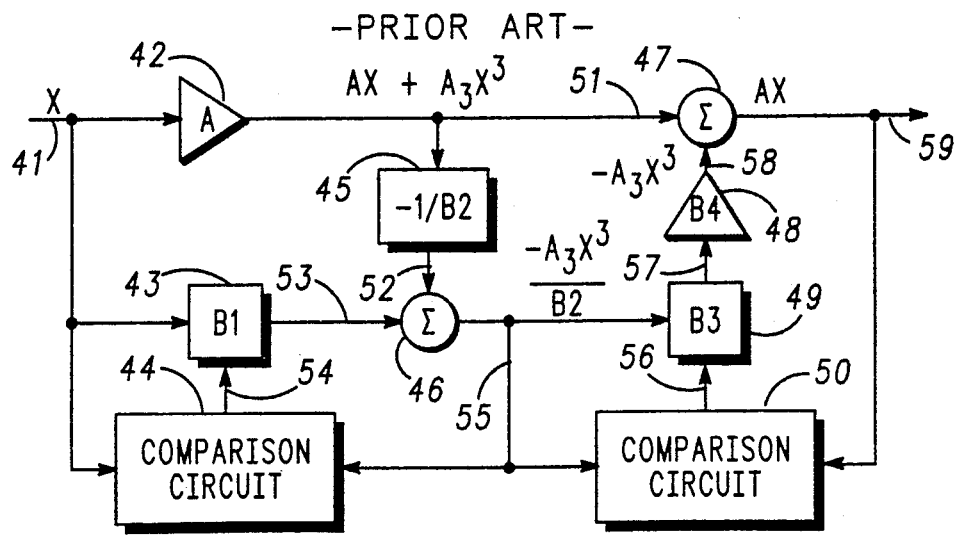
Figure 4:
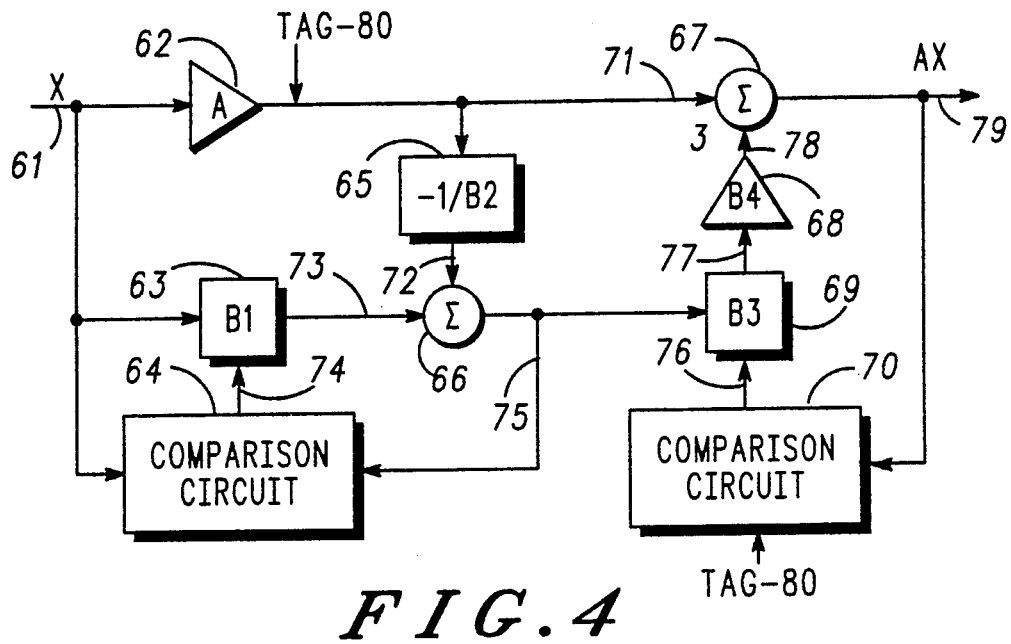
Figure 5:
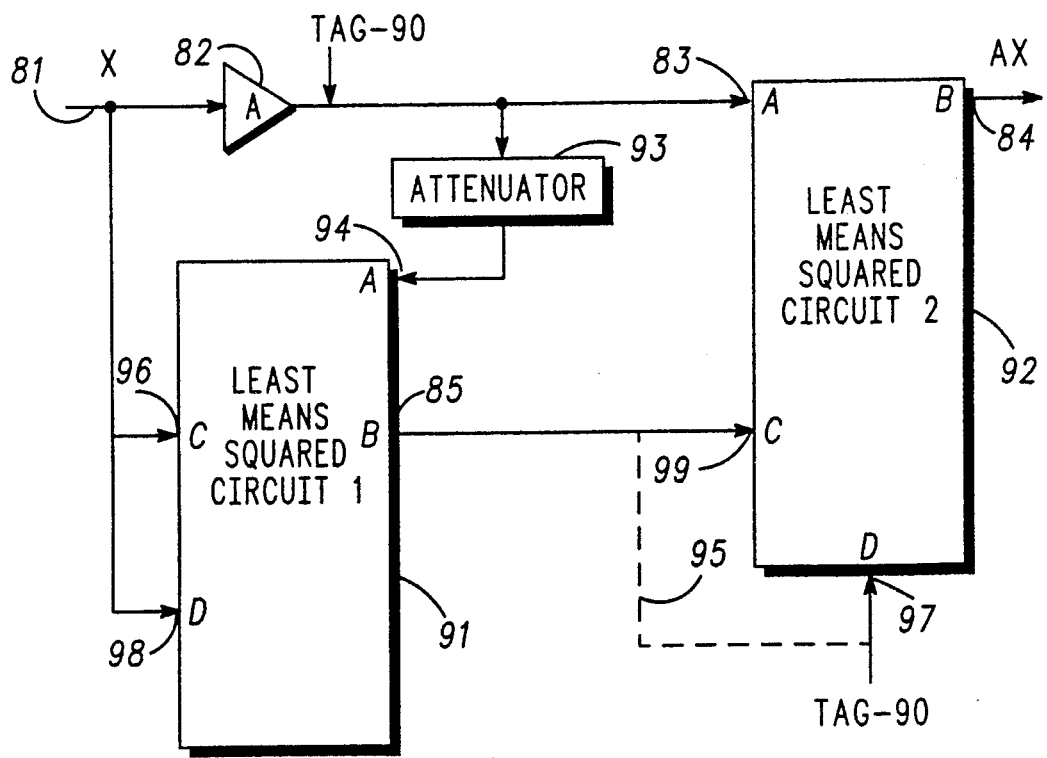
FIG. 5 shows a first embodiment of a feedforward distortion cancellation circuit, according to the invention.

Referring now to FIG. 5, there is shown a first embodiment of a feedforward distortion cancellation circuit, according to the invention. The input x (81) is applied to the input of amplifier 82, and also to the cancellation (C) port 96 and reference (D) port 98 of a first least means squared circuit 91. A pilot signal 90 is applied to the output of amplifier 82 and also to the reference (D) port 97 of a second least means squared circuit 92. The output of amplifier output 82 is coupled to the input of an attenuator 93 and to the input (A) port 83 of the second least means squared circuit 92. The output of attenuator 93 is coupled to the input (A) port 94 of the first least means squared circuit 91. The output (B) port 85 of the first least means squared circuit 91 is coupled to the cancellation (C) port 99 of the second least means squared circuit 92. The output (B) port of the second least means squared circuit 92 is coupled to the output 84. The amplitude and phase of the first cancellation signal at the cancellation port 96 of the first least means squared circuit 91 is adjusted so that cancellation of the desired signal in the sample of the output of amplifier 82 occurs at the output port 85. The maximum attenuation obtainable by the least means squared circuit is the S/N ratio of the reference signal. The achievable cancellation can be less due to imperfection in the least means squared circuits. The use of attenuator 93 reduces the power and linearity requirements of the active components of the first least means squared circuit 91.

Figure 6:
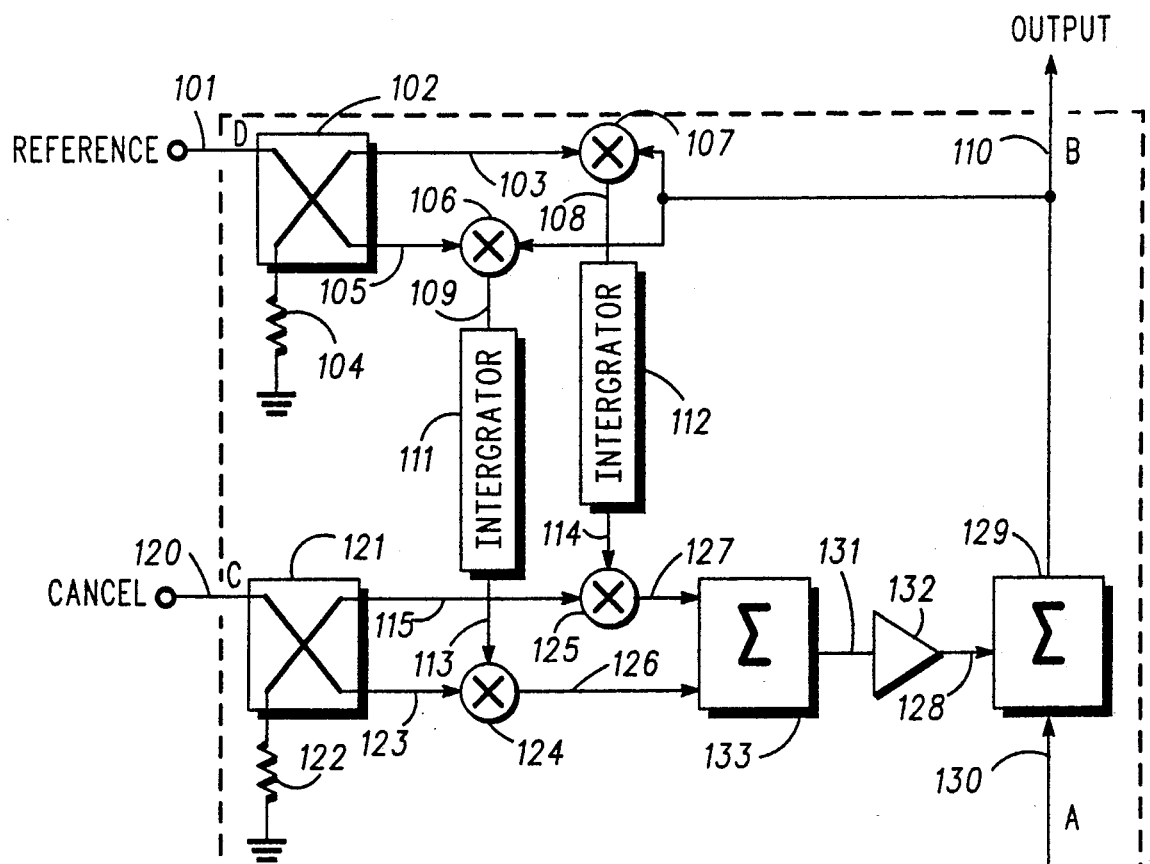
FIG. 6 shows the least means squared circuit of the first embodiment.

The least means squared circuit itself is shown in FIG. 6. As is known in the art, the least means squared circuit is able to actively cancel a known signal in the presence of other signals. This will be explained below.

The good copy of the desired signal to be cancelled is put into the cancellation (C) port 120. This signal contains a sample of the reference signal. This composite signal is split into two copies 115 and 123 that are phase-shifted by 90 degrees and thus are in quadrature. These two signals are then applied to two mixers (weighters) 124 and 125 that amplitude modulate the signal by the control signals 113 and 114. The outputs 126 and 127 of the two mixers are summed together by summer 133 to provide a copy 131 of the desired signal that is controllable in amplitude and relative phase to that of the signal at the cancellation port 120.

The input signal (A) 130, which contains the signal to be cancelled and a sample of the reference signal as well as other signals, is fed to the summer circuit 129 along with the weighted copy of the cancellation signal 128. The maximum magnitude of the cancellation signal 128 must always be greater than the input signal 130 for the circuit to operate properly.

The reference signal (D) 101 is split into two signals, in-phase signal 103 and quadrature signal 105, which are input to the two correlators 106 and 107. The output of the summer 129 is the other input to the correlators 106 and 107. The outputs 108 and 109 of the correlators are fed to integrators 111 and 112 to filter out the signals that are caused by the mixing of the reference signals with other signals. The outputs of the integrators 113 and 114 provide the control signals to the weighters 124 and 125.

The sense of the feedback in the least means circuit is negative. As with all negative feedback circuits, the magnitude of the error signal is made small by using a large loop gain. For this application the error signal is the output (B) 110 of the summer circuit 129 which is connected to the input 130, and the large loop gain results from the use of integrators following the correlators.

In FIG. 6, the amplitude and phase relationship between the reference signal 101 and the signal desired to be cancelled is maintained between the input port 130 and the cancellation port 120. As a result, as the reference signal 101 is cancelled the cancellation component of the input signal 130 is also cancelled at the summing point 110.

Figure 7:
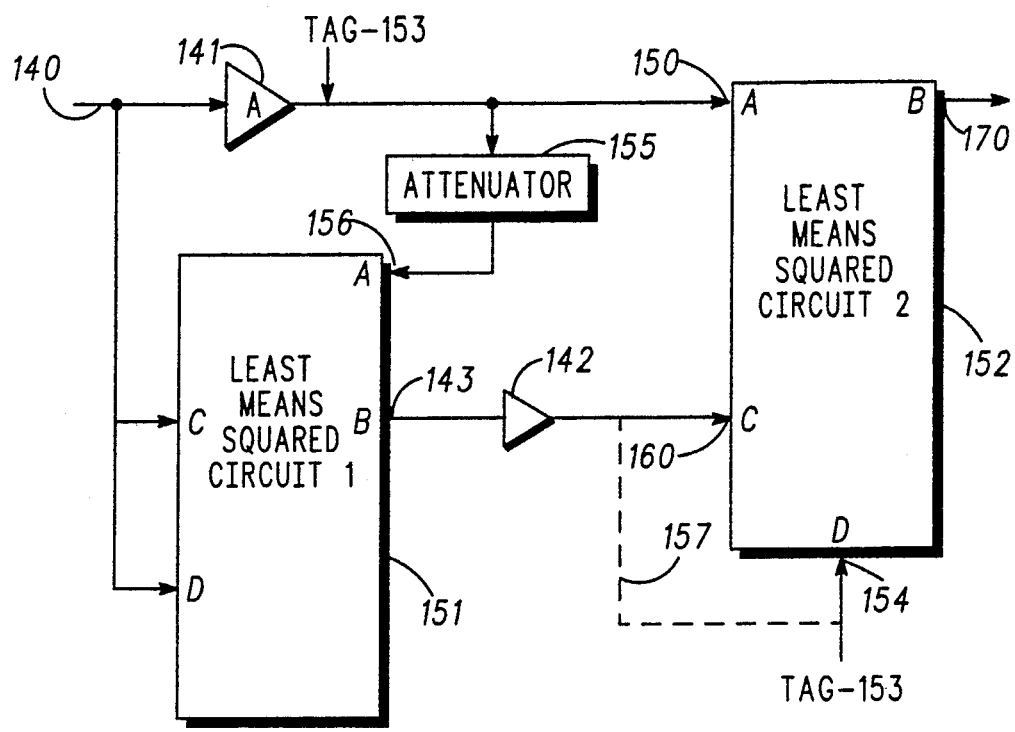
FIG. 7 shows a second embodiment of a feedforward distortion cancellation circuit, according to the invention.

FIG. 7 shows a second embodiment of a feedforward distortion cancellation circuit, according to the invention. The principal difference between the embodiment of FIG. 5 and the embodiment of FIG. 7 is the introduction of a second amplifier 142 between the output (B) port 143 of the first least means squared circuit 151 and the cancellation (C) port 160 of the second least means squared circuit 152. As shown, pilot signal 153 is input to the output of the main forward gain amplifier 141, and also to the reference (D) port 154 of the second least means squared circuit 152.

Assume the gain of amplifier 142 is 30 dB, and that the desired intermodulation ratio (IMR) of the main forward gain amplifier 141 is 60 dB. This means that the input signal 140 must have an inter-modulation ratio that is better than 60 dB. If the basic inter-modulation ratio of the amplifier 141 is 30 dB, the desired signal must be cancelled by 60 dB in the first least means squared circuit 151 if it is also used as the reference signal to the second least means squared circuit 152. As is known, such a level of cancellation is difficult to achieve with reasonable stability.

By using the pilot signal available in the output (B) port 143 of the first least means squared circuit 151, however, it is only necessary to cancel the desired signal by about 30 dB, or to the level of the distortion components. This level of cancellation is chosen to minimize the required cancellation of the desired signal by the second least means squared circuit. The loss of the desired signal is about 0.27 dB due to the 30 dB of cancellation in the first least means squared circuit. This composite signal 143 of distortion, pilot signal and attenuated desired signal is amplified by amplifier 142 and fed as the cancellation (C) signal 160 to the second least means squared circuit 152. The pilot signal is also applied to the reference (D) port 154 of the second least means squared circuit 152.

The amplitude and phase of this cancellation signal 160 is adjusted so that the pilot signal is equal in amplitude and out of phase with the pilot signal on the output of the main forward gain amplifier 141. If the time delays of the two paths are matched between the point where the pilot signal is added and the point where the cancellation takes place, the amplitude and phase relationship between the pilot signal and the distortion components will be fixed. Thus, when the pilot signal is cancelled the maximum, the distortion components will also be cancelled the maximum. Since the S/N of the pilot signal reference is high, an excellent cancellation may be obtained in the second least means squared circuit. The cancellation required in the second least means squared circuit is in the order of 30 dB to achieve the 60 dB inter-modulation ratio system requirement.

As a result, by the use of a pilot signal it is thus possible to achieve the desired 60 dB inter-modulation ratio without requiring either least means squared circuit itself to achieve more than 30 dB of cancellation.

One application of feedforward cancellation is to improve the intermodulation (IM) distortion capabilities of a linear transmitter. This technique involves the separation of the distortion components of the amplifier output from the desired signal. These distortion components are then amplified and subtracted from the main amplifier output signal to provide improved inter-modulation characteristics.

It should be obvious to one skilled in the art that the use of the least means squared circuit is also applicable to feedforward distortion cancellation circuits that do not utilize the pilot signal (TAG). With reference to FIG. 5, for example, this would mean pilot signal 90 would be absent and the cancellation (C) port 99 and the reference (D) port 97 of the second least means squared circuit 92 would be coupled together by means of path 95 (shown in dotted lines). Similarly, with reference to FIG. 7, this would mean the pilot signal 153 would be absent and the cancellation (C) port 160 and the reference (D) port 154 of the second least means squared circuit 152 would be coupled together by means of path 157 (shown in dotted lines).

While various embodiments of the feedforward distortion cancellation circuit, according to the present invention, have been described hereinabove, the scope of the invention is defined by the following claims.

What is claimed is:

1. A feedforward cancellation circuit having an input signal and an output signal, the circuit comprising:
   a gain device having an input and an output,
   a first and second least means squared circuit, each circuit having an input port, an output port, a cancellation port, and a reference port,
   said feedforward cancellation circuit input signal coupled to said gain device input and to said first least means squared circuit cancellation and reference ports,
   said gain device output coupled to said first least means squared circuit input port and to said second least means squared circuit input port,
   said first least means squared circuit output port coupled to said second least means squared circuit cancellation port,
   said second least means squared circuit output port coupled to said feedforward cancellation circuit output signal, and
   a pilot signal or "TAG" coupled to said first least means squared circuit input port and to said second least means squared circuit input port and to said second least means squared circuit reference port, said second least means squared circuit reference port being electrically isolated from said second least means squared circuit cancellation port.

2. The feedforward cancellation circuit of claim 1 having an attenuator in series with said first least means squared circuit input port.

3. A feedforward cancellation circuit having an input signal and an output signal, the circuit comprising:
- a first gain device having an input and an output,
- a second gain device having an input and an output
- a first and second least means squared circuit, each circuit having an input port, an output port, a cancellation port, and a reference port,
- said feedforward cancellation circuit input signal coupled to said first gain device input and to said first least means squared circuit cancellation and reference ports,
- said first gain device output coupled to said first least means squared circuit input port and to said second least means squared circuit input port,
- said first least means squared circuit output port coupled to said second gain device input,
- said second gain device output coupled to said second least means squared circuit cancellation port,
- said second least means squared circuit output port coupled to said feedforward cancellation circuit output signal, and
- a pilot signal or "TAG" coupled to said first least means squared circuit input port and to said second least means squared circuit input port and to said second least means squared circuit reference port,
- said second least means squared circuit reference port being electrically isolated from said second least means squared circuit cancellation port.

4. The feedforward cancellation circuit of claim 3 having an attenuator in series with said first least means squared circuit input port.

* * * * *

UNITED STATES PATENT AND TRADEMARK OFFICE
CERTIFICATE OF CORRECTION

PATENT NO. : 5,051,704

DATED : 09/24/91

INVENTOR(S) : Ronald H. Chapman and William J. Turney

It is certified that error appears in the above-identified patent and that said Letters Patent is hereby corrected as shown below:

In the Abstract:

In the first line of the abstract "circuit active" should be --circuit with active--.

Signed and Sealed this

Thirtieth Day of March, 1993

Attest:

STEPHEN G. KUNIN

Attesting Officer

Acting Commissioner of Patents and Trademarks